United States Patent [19]

Friedman

[11] 4,027,470

[45] June 7, 1977

[54] DIGITAL TIMER CIRCUIT

[76] Inventor: Eliot I. Friedman, 1175 Wendy Road, Ann Arbor, Mich. 48103

[22] Filed: Apr. 4, 1975

[21] Appl. No.: 565,233

[52] U.S. Cl. .............................. 58/39.5; 235/92 T; 58/21.13; 58/38 R; 324/78 D

[51] Int. Cl.² ...................... G04F 3/02; G04F 8/20; G06F 7/38; G01R 23/02

[58] Field of Search ............. 58/21.13, 21.14, 23 R, 58/23 A, 23 AC, 24–26, 38, 39.5, 50 R, 152 R, 152 B, ; 235/92 EA, 92 PE, 92 R, 92 T; 328/48

[56] References Cited

UNITED STATES PATENTS

| | | | |
|---|---|---|---|
| 3,664,116 | 5/1972 | Emerson et al. | 58/38 |
| 3,876,869 | 4/1975 | Houpt | 235/92 T |
| 3,878,370 | 4/1975 | Santomango et al. | 235/92 T |

*Primary Examiner*—E. S. Jackmon
*Attorney, Agent, or Firm*—Cullen, Settle, Sloman & Cantor

[57] ABSTRACT

An improved method of operating a digital timer using line currents of different frequencies such as 50 and 60 hertz. The line current is rectified and converted into square wave pulses at the line current frequency. Upon actuation of a start switch to initiate the timing cycle, the logic circuitry is cleared and synchronized at the line current frequency. The square wave pulses are compared to internally generated clock pulses to determine the line current frequency, and then modified along parallel paths to provide pulses at various frequencies including timing pulses at a timing frequency of ten hertz. The timing interval may be manually or automatically externally established and counters are incremented by the timing pulses at the timing frequency of ten hertz. A comparator actuates a signal when the value in the counters equals the desired timing interval. A scale factor is provided to increase the capacity of the counters by decreasing the timing pulse frequency to 1 hertz. A visible display is provided which increments as the counters increment to provide an indication of the elapsed time.

The digital timer circuitry includes a Schmitt trigger to square wave rectify the line current and a synchronization circuit which is actuated in response to an external signal to initiate the timing interval. The synchronization circuit clears the logic circuitry and sets the circuitry on the next square wave pulse to enable all subsequent square wave pulses to be converted into timing pulses to increment the counter. A differentiator circuit is provided to determine the line current frequency by determining the frequency of the square wave pulses and a frequency modification circuit operates in parallel paths to provide a plurality of pulses at different frequencies one of which is the ten hertz frequency. The differentiator circuit allows only the ten hertz pulses to increment the counter. A scaling circuit is provided to divide the timing frequency pulses of 10 hertz into reduced timing frequency pulses of 1 hertz thereby increasing the capacity of the counters. Comparators read the value in the counters and actuate a signal when the value in the counters equals the desired timing interval which, in turn, may be manually or automatically externally established. A visual display is coupled to the counters and increments with the counters to provide an indication of the elapsed time.

15 Claims, 9 Drawing Figures

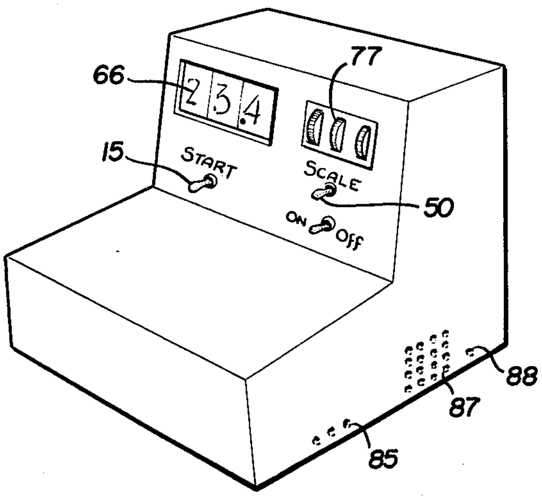
FIG. 1
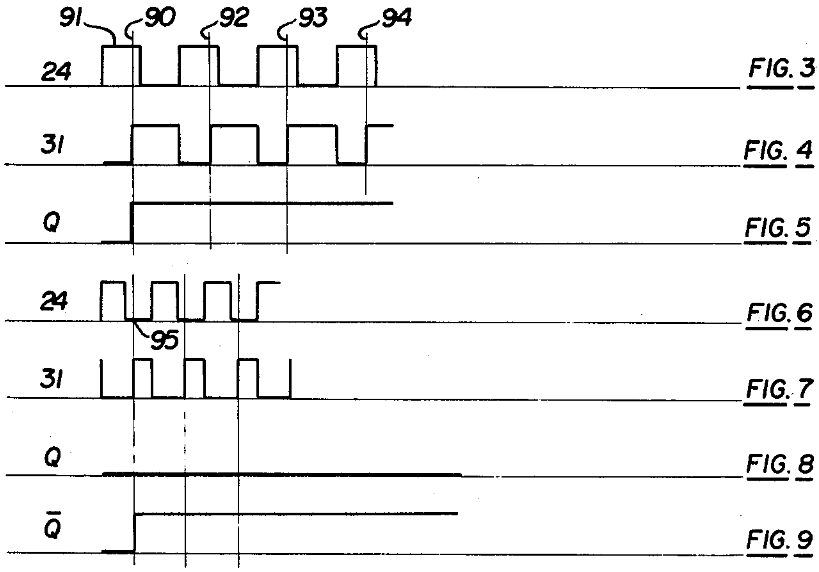
FIG. 3
FIG. 4
FIG. 5
FIG. 6
FIG. 7
FIG. 8
FIG. 9

DIGITAL TIMER CIRCUIT

BACKGROUND OF THE INVENTION

This invention relates to digital timing circuits in general, and, more particularly, to a more versatile digital timer. Although digital timers are, of course, well known, there are various limitations and problems with the prior timers.

First digital timers respond to a particular line frequency such as 60 hertz and require expensive converters to be operable on 50 hertz line current as found throughout Europe.

The prior art digital timers usually include an internal clock to increment counters at a predetermined clock frequency. Synchronization occurs at the internal clock frequency which is slower than the line current frequency. When the timer circuitry is being utilized to monitor the infusion of a medicine, this present a significant and observable delay between actuation of the timer and commencement of the timing interval, which, of course, occurs only after synchronization has taken place. This delay, of course, is a significant psychological detriment to the patient.

Yet another type of problem which occurs in the prior art timers is related to the mechanism for selecting and establishing the timing interval. Typically, dials or other manual switches are provided on the timer itself for selection of the timing interval. However, in photography for example, there are many instances where an externally generated signal will more accurately establish the timing interval. Thus, during time exposure of photography, a light meter connected to a timer will provide a more accurate signal of the desired timing interval based upon the available light and, furthermore, can provide a variable signal if the available light changes. Furthermore, in the photography dark room, devices which sense the optical density of the negative provide a much more accurate determination of the amount of exposure time necessary to print the picture. Such a device which senses optical density as the photographic enlarger is turned on, may provide an immediate external signal through a timer to determine the duration of the timing or exposure interval.

Another problem with the prior art timers is directed to the number of counters within the timer itself. Obviously, the range of the timer is limited by the number of counters.

Finally, many uses of a timer including both photography and medicine require the availability of a changing display indicative of the elapsed time. For example, if a patient is receiving an infusion of medicine over the three minute interval but during that three minute interval it is necessary for the technician to extract a blood sample, an accurate display of the elapsed time is necessary.

Thus, the invention herein is directed to an improved timer circuit and method of operating a timer circuit to overcome the aforementioned disadvantages of prior art digital timers.

SUMMARY OF THE INVENTION

The present invention overcomes the prior art disadvantages by providing an improved digital timer circuit and method of operating a digital timer circuit.

The timer of the present invention is operable at both 50 and 60 hertz line current, thus eliminating the need for external frequency conversion.

The present invention includes a timer which is synchronized at the line current frequency, even though the internal counters are incremented at a slower frequency.

Furthermore, the timer of the present invention provides for both manual establishment of the timing interval and for the automatic external establishment of the timing interval.

In addition, the timer of the present invention provides a scaling feature by decreasing the frequency of pulses which increment the counters when a longer time interval is to be measured.

Next, the timer of the present invention provides a visual display which is incremented as the counters are incremented to provide a visual indication of the elapsed time.

The timer of the present invention includes a differentiating circuit to determine the line current frequency, whether it be 50 or 60 hertz, and convert the line current frequency into timing pulses at a 10 hertz frequency. These timing pulses are utilized to increment the counter except when the scaling factor is required, in which case the 10 hertz timing pulses are reduced to one hertz timing pulses. The synchronization occurs at the 50 or 60 hertz line frequency rate, thus the timing interval commences within 20 milliseconds after the start switch is depressed.

BRIEF DESCRIPTION OF THE DRAWINGS

The foregoing objects and advantages of the present invention, together with other advantages which may be attained by its use, will become more apparent upon reading the following detailed description, taken in conjunction with the drawings.

In the drawings, wherein like reference numerals identify corresponding circuit components:

FIG. 1 is a perspective illustration of the timer including the circuit of the present invention;

FIGS. 3 to 9 are timing diagrams indicating the operation of part of the logic circuitry of the present invention.

DETAILED DESCRIPTION OF THE INVENTION

Figure 2:
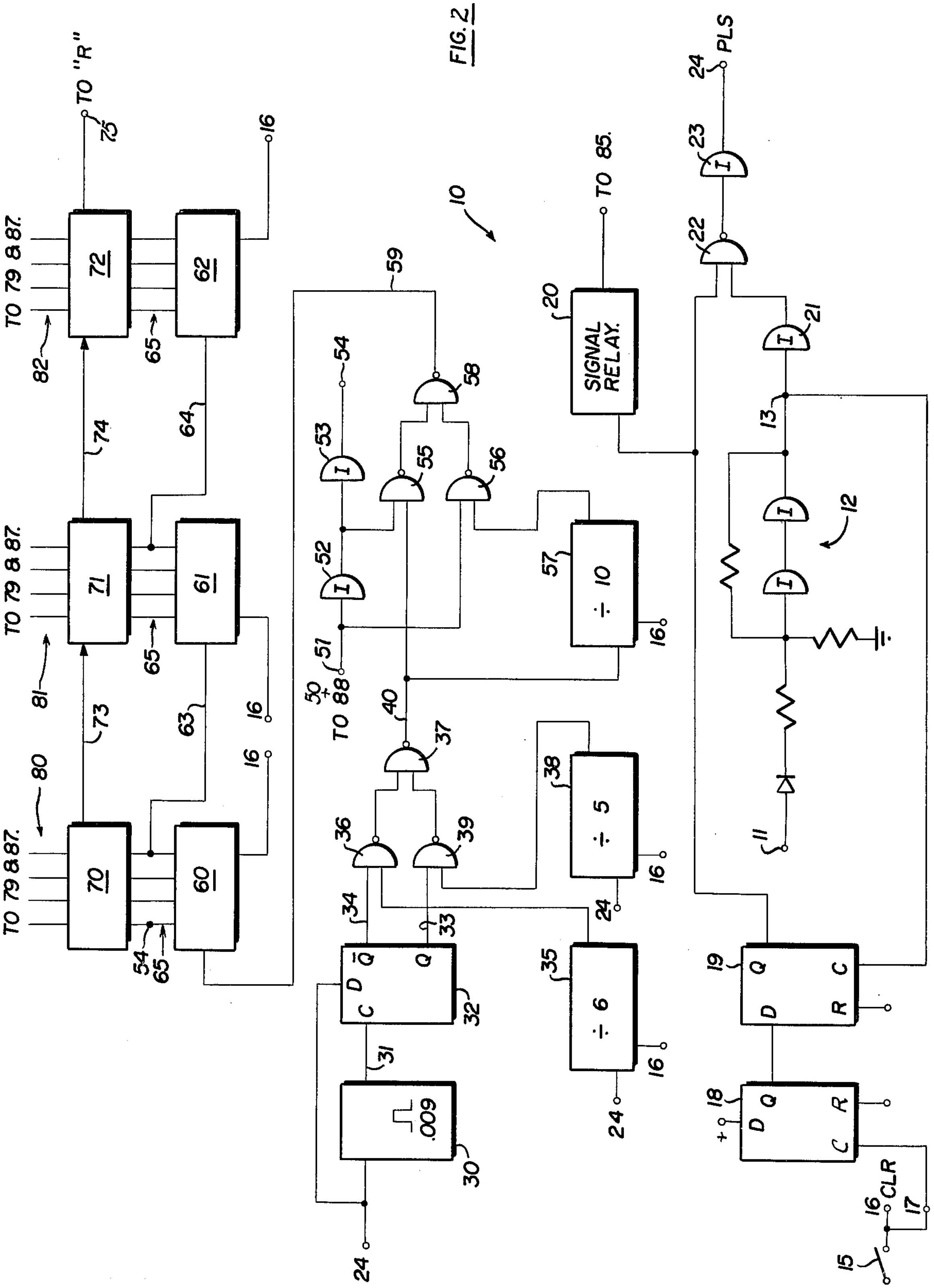
FIG. 2 is a logic diagram of the circuit of the present invention.

As shown in the drawings, the timer of the present invention includes a logic circuit 10 receiving line current at a line current terminal 11. The line current which may be either 50 or 60 hertz, is halfwave rectified and converted into square waves by a Schmitt trigger 12, the output of which is illustrated at terminal 13.

Means are provided for synchronizing the timer circuitry 10 at the line current frequency. A start switch 15 is illustrated on the timer of FIG. 1 and activation of the start switch 15 provides a pulse at terminal 16 to clear the logic circuitry. Simultaneously, a pulse at the second output terminal 17 of the switch 15 serves as the clock input pulse to a first D-type flip flop 18. The D-type flip flop 18 is biased with the D or data input permanently high and thus provides a Q output to the D input terminal of a second D-type flip flop 19 when the clock pulse is provided by activation of the start switch 15.

The next square wave at terminal 13 appears as the clock input to the D-type flip flop 19 providing a Q output which sets a relay 20 to initiate the timing cycle. It may be appreciated, therefore, that the timing circuit has been initiated on the first line current pulse after activation of the start switch 15. If the line current is either 50 or 60 hertz then the timing interval starts no later than 20 milliseconds after activation of the start switch 15.

The square wave pulse from terminal 13 which clocks the second D-type flip flop 19 also passes through a first inverter 21 and appears as one input to the NAND gate 22. The second input to the NAND gate 22 is the Q output from the flip flop 19 which goes high in response to that pulse. Since the first D-type flip flop 18 is not clocked again (because the start switch is not depressed again), the data input to the second flip flop 19 remains high and on all successive square wave pulses to the flip flop 19, the Q output remains high thus keeping NAND gate 22 open for passage of all successive pulses. All successive pulses, therefore, are inverted by inverter 23 and appear as output pulses at pulse terminal 24.

The next aspect of the present invention is the provision of means to determine the frequency of these square wave pulses at terminal 24, i.e., to differentiate between 50 hertz and 60 hertz pulses and to generate timing pulses at the desired timing frequency of 10 hertz. To explain this feature, it should be remembered that a line frequency of 50 hertz serving as the input to the Schmitt trigger provides square wave pulses having a pulse width of 10 milliseconds on and 10 milliseconds off while a line frequency of 60 hertz provides square wave pulses of 8.33 milliseconds on and 8.33 milliseconds off.

The differentiation and converting circuit includes a retriggerable monostable multivibrator 30 generating output pulses of approximately 9 milliseconds. The pulse output from the monostable multivibrator which operates as internal clock pulses, must have a pulse width greater than the 8.33 milliseconds and equal to or less than 10 milliseconds. The pulse output from the multivibrator 30 appears on lead 31, as the clock input to a second D-type flip flop 32. Flip flop 32 takes its data input from the pulse terminal 24.

The timing sequence and operation of the D-type flip flop 32 will now be explained. If the line current is 50 hertz then the pulse width is 10 milliseconds. The pulse which triggers the monostable, therefore, has a 10 millisecond duration, but the clocking pulse from the monostable multivibrator has a 9 millisecond duration. The monostable multivibrator is wired to provide negative going pulses which, therefore, go high at the end of the 9 millisecond interval. This positive or high going transition is the clock input to the flip flop 32 and in the case of a 10 millisecond pulse provides coincidence between the occurrence of the positive transition on line 31 and a positive signal at the D or data input. This sets Q high on line 33 and Q low on line 34.

If, however, the line frequency was 60 hertz, the pulse width of 8.33 milliseconds at the D or data input to the flip flop 32 would have returned to zero at the end of 8.33 milliseconds prior to the positive going transition on line 31 (the clock pulse) at the end of the 9 millisecond pulse output from the retriggerable monostable multivibrator 30. Thus, there would be no signal at the data input to the flip flop 32 and Q would be low on line 33 and Q would be high on line 34.

Hence, the determination of line frequency is indicated by the specific presence and absence of high and low signals on lines 33 and lines 34, respectively.

Simultaneously with the determination of the line frequency, the line frequency is modified to provide timing frequency pulses at 10 hertz. A first counter 35 which is a divide by six counter such as a 7492 divide by 12 counter with the divide by 2 state bypassed, provides output pulses to one input of the NAND gate 36. The other input to the NAND gate 36 is taken from line 34.

If, in fact, the line current was 60 hertz, then 10 pulses per second are passed from the counter 35 to the NAND gate 36. Since the output on lead 34 is high, each of the pulses through the NAND gate 36 are enabled and pass to a second NAND gate 37. If, however, the line current was 50 hertz, then the pulse rate from the counter 35 would be 8.33 hertz but line 34 would show a low signal, and NAND gate 36, therefore, would show a constant high output to the NAND gate 37.

A second counter 38 is provided to divide the line current by 5. This would be a 7490 decade counter with the divide by 2 state bypassed to provide a divide by 5 function. Every fifth pulse, therefore, is provided as one input to a NAND gate 39, the other input to which is provided along line 33. Again, if the line current frequency were 50 hertz, then the signal along lead 33 would be high and each pulse from the counter 38 would be passed through the NAND gate 39 to the NAND gate 37. If, however, the line frequency were 60 hertz, then the output of the counter 38 would be 12 pulses per second but the signal on line 33 would be low, and the output from NAND gate 39 would be consistently high opening the NAND gate 37 to the pulses from NAND gate 36.

Thus, in summary, regardless of the input frequency, i.e., 50 or 60 hertz, the NAND gates 36, 37 and 39 in conjunction with the Q and Q outputs from flip flop 32 enable output pulses to appear on line 40, the output of NAND gate 37 at the rate of 10 pulses per second. It is noted that each counter 35, 38 includes an input terminal 16 to receive a pulse to clear the value stored in the counter at the initiation of each timing cycle by activation of the start switch 15.

In order to explain the circuitry in the path followed by the pulses, the range or scaling factor will now be explained. A signal from the range or scaling switch 50 is indicated as appearing at terminal 51 and passes through a first inverter 52. The output from inverter 52 is fed to a second inverter 53 to provide a signal at terminal 54 to establish a decimal point in a visual display as will be explained in greater detail hereafter. The output from the first inverter 52 is also presented as one input to a NAND gate 55, the second input to which is the 10 pulse per second output on line 40 from the NAND gate 37.

The input at terminal 51 from the scale switch 50 is also fed to a second NAND gate 56. Another divide by 10 counter such as a 7490 is provided, specifically counter 57 which takes as its input the output pulses at 10 pulses per second from line 40. The output of the counter 57 is, therefore, one pulse per second to the NAND gate 56. The output of the the NAND gates 55 and 56 serve as inputs to a NAND gate 58 having an output 59. The operation of this aspect of the circuit will now be explained.

Assume in the first instance that the range switch 50 is low providing a low signal at 51 indicating the lower range for which timing pulses at 10 hertz is desired. The output of inverter 52 is high providing a high input to one side of the NAND gate 55. The 10 per second from terminal 40 to NAND gate 55 result in inverted pulses, i.e., 10 low going pulses per second. Since the signal on line 51 is low and since this is strapped to the NAND gate 56, the output of NAND gate 56 is always high providing a high or enabling input to the NAND gate 58. Hence, each low going pulse from NAND gate 58 results in a high or positive pulse on line 59 as the output of NAND gate 58. Hence, 10 pulses per second appear on line 59.

If, however, the range switch 50 were high providing a high signal on line 51, inverter 52 has a resulting low signal which is again inverted by inverter 53 to remove the decimal point in the visual display at terminal 54. At the same time, the low signal from the inverter 52 provides a low input to the NAND gate 55 which provides a high output from NAND gate 55 irrespective of the 10 pulse per second from line 40 and this high output from the NAND gate 55 serves to enable NAND gate 58. The high input from the range switch 50 is also tied to the NAND gate 56 and in response to the one pulse per second output from the counter 57, NAND gate 56 goes low one time per second providing a low input to the NAND gate 58 one time per second, resulting in output pulses on line 59 at a timing frequency of one hertz. Counter 57 has an input terminal 16 to provide clearing signals during synchronization of the circuit.

Thus the circuitry of the present invention provides pulses on line 59 at optional frequency rates of 1 hertz or 10 hertz, depending upon the scale chosen by the operator of the timer. These timing pulses are generated regardless of the line current frequency.

The output of the timing pulses on line 59 serve as the input to a series of decade counters such as 7490's. Three counters are used, counters 60, 61 and 62, and they are cascaded, i.e., the output of counter 60 is tied by a lead 63 to the input of counter 61 and the output of counter 61 is tied by a lead 64 to the input of counter 62. This arrangement provides for binary coded decimal counting as is well known with counter 60 representative of the units place, counter 61 representative of the 10's place and counter 62 representative of the 100's place in the absence of a decimal point.

The output of each counter is tied via parallel leads 65 to the terminals of the light emitting diodes 66 illustrated in FIG. 1. In addition, the output of the counters are tied along the same leads 65 to five bit comparators such as Fairchild 9324's. These five bit comparators 70 71 and 72 compare the signals in the counters 60, 61 and 62, respectively, with the fifth bit in each comparator tied to enable the next comparator as illustrated on lead 73 and 74, respectively, and with the A=B output of the third comparator 72 connected as an output signal at terminal 75.

The present invention provides for two techniques to establish values in the comparators to be compared with the incrementing values in the counter. First, as illustrated in FIG. 1, a plurality of dials 79 provide inputs on parallel leads 80, 81 and 82 (FIG. 2), respectively to each of the three comparators 70, 71 and 72. Thus, each dial provides an input to one of the comparators in a BCD or binary coded decimal form. The other input to each comparator is, of course, taken from the counter. When the value in the counter equals the value from the dials 79, an output signal appears at terminal 75. This signal at terminal 75 resets the two flip flops 18 and 19 at the "R" terminals thus causing the Q output of flip flop 19 to go low, thus indicating to the signals means 20 the termination of the timing interval.

The signal means 20 could be any type or combination of audio or visual means or controls for controlling external operations at output terminals 85 on the timer itself.

In addition, means are provided to externally program the timer of the present invention.

External terminals 87 are illustrated on the timer of FIG. 1. These are coupled to the lines 80, 81 and 82 in groups of four, respectively, and take an external signal and provide input signals to the comparators 70, 71 and 72 in the identical fashion as the operation of the dials 79. Hence, external signals can be utilized to establish the duration of the timing interval.

The decimal point terminal 54 described previously is connected to the appropriate decimal point of the light emitting diode 66 coupled only to the counter 60. With the range switch 50 in the low position, setting the dials 79 to a value such as 317 corresponds to 31.7 seconds. Hence, this low signal at terminal 51 results in a signal at terminal 54 connected to the light emitting diode associated with counter 60. Since the counters increment at the rate of 10 pulses per second with the scale switch 50 in the low position, each of these counter increments changes the visual display from the light emitting diodes at a rate of ten changes per seconds.

If the scale select switch is in the high position, then the decimal point is not indicated by the light emitting diodes and the pulses at one pulse per second at line 59 increment the counters at the slower timing pulse frequency.

When the external terminals 87 are used to program the timing interval, signal at terminal 88 (FIG. 1) corresponds to the signal at terminal 51 from the scale switch 50.

FIGS. 3–9 illustrate a timing diagram explaining the operation of the circuit to determine the actual line frequncy. FIGS. 3, 4 and 5 taken together, assume that the line current is 50 hertz. FIG. 3 indicates a 50 hertz cycle, i.e., pulses of ten millisecond duration and FIG. 4 indicates the output of the monostable multivibrator 30 (which is internally inverted) to provide a negative pulse of nine millisecond duration having an upward or positive going transition at the end of nine milliseconds.

At nine milliseconds after commencement of the pulses at terminal 24, as shown by the vertical line 90, the positive going transition of FIG. 4 coincides with a pulse 91 of FIG. 3 which is still positive. This provides coincidence of a high or data signal representative of pulse 91 and the positive transition of FIG. 4 indicating the clocking pulse to the flip flop 32. This turns the Q output of flip flop 32 high as illustrated in FIG. 5, and this remains high since at each successive positive going transition 92, 93 for the monostable there is the existance of a pulse at FIG. 3.

If, however, there is a 60 hertz cycle as illustrated in FIG. 6, the pulse width is 8.33 seconds. FIG. 7 illustrates the clocking pulses from the monostable multivibrator 30 which have a duration of 9 milliseconds. Hence, 9 milliseconds after the initiation of the pulse, as illustrated by the vertical line 90, the positive transition from the multivibrator 30 occurs when there is no positive signal on the data input as indicated by the zero output at 95 on FIG. 6. Hence, the Q output from the flip flop 32 is low and remains low as illustrated in FIG. 8, while the Q output of FIG. 9 which appears on line 34 goes high and remains high. Since the multivibrator is retriggerable, each positive transition of the pulse from terminal 24 as illustrated in FIG. 6 triggers the monostable multivibrator as shown by the output pulses on FIG. 7.

This explains the timing circuitry for differentiating between input signals.

The foregoing is a complete description of the preferred embodiment of the improved timing circuit of the present invention. It must be appreciated that many changes in the circuit components may be made without departing from the spirit and scope of the present invention. The invention, therefore should be limited only the scope of the following claims.

What is claimed is:

1. In a method of operating a digital timer on line currents of different frequencies, including half-wave rectifying the line current for converting the line current into square wave pulses, counting timing pulses in counters at a frequency different from the line current frequency by incrementing the counters, and comparing the value in the counters with the desired timing interval to generate an output signal when the values in the counters equals the desired timing interval, and actuating a starting switch to clear the counters, the improvement comprising:

initiating and synchronizing the incrementing of the counters by clearing the counters in response to the next square wave pulse and enabling all successive square pulses thereafter to be converted into timing pulses;

then determining the frequency of the line current by determining the frequency of the square wave pulses;

simultaneously modifying square wave pulses on parallel paths to provide output pulses at different frequencies, one of which equals the timing pulse frequency; and enabling only output pulses at the timing pulse frequency to increment the counters.

2. The improvement as defined in claim 1 including the preliminary step of manually setting comparators to the desired timing interval prior to initiating and synchronizing the incrementing of said counters.

3. The invention as defined in claim 1 and including externally setting comparators to the desired timing interval prior to the step of initiating and synchronizing the incrementing of the counters.

4. The invention as defined in claim 1 and further including the step of visually displaying the elapsed time simultaneously with incrementing the counters.

5. The invention as defined in claim 1 and further including the step of selecting a scale prior to initiating and synchronizing the incrementing of the counter to increase the capacity of the counters.

6. In a digital timer logic circuit responsive to line current of different frequencies and including a half-wave rectifier circuit to convert the line current into square wave pulses or the like, counter means incremented by timing pulses, means for comparing the value of the counter means with the desired timing interval, signal means actuated by the comparing means when the value in the counter means equals the desired timing interval, and a start switch to clear the logic circuit including the counters, the improvement comprising:

means for converting the square wave pulses into timing pulses;

first indicator means for manually establishing the desired timing interval, said first indicator means coupled to said comparing means and said first indicator means providing a visual output of the desired timing interval; and second indicator means coupled to said comparing means for automatically establishing the desired timing interval in response to external signals.

7. The invention as defined in claim 6 and further including third indicator means coupled to the counter means for providing a changing visual display of the elapsed time within the timing interval.

8. In a digital timer logic circuit responsive to line current of different frequencies and including a half-wave rectifier circuit to convert the line current into square wave pulses or the like, counter means incremented by timing pulses, means for comparing the value in the counter means with a desired timing interval, signal means actuated by the comparing means when the desired timing interval equals the value in the counter means, and a start switch to clear the logic circuit, the improvement comprising:

a synchronization circuit responsive to actuation of the start switch to clear the counter means;

said synchronization circuit response to the first square wave pulse occurring after actuation of said start switch to start the timing interval by simultaneously enabling the signal means and enabling successive square wave pulses to be converted into timing pulses; and means for automatically determining the frequency of said square wave pulses and for thereafter converting said square wave pulses into timing pulses at a predetermined frequency different from the line current frequency.

9. In a digital timer logic circuit response to line current of different frequencies and including a half-wave rectifier circuit to convert the line current into square wave pulses or the like, counter means incremented by timing pulses, means for comparing the value of the counter means with the desired timing interval, signal means actuated by the comparing means when the value in the counter means equals the desired time interval, and a start switch to clear the logic circuit, the signal means and the counter means, the improvement comprising:

a differentiating circuit for receiving said square wave pulses at said line current frequency and for automatically determining the line current frequency of said square wave pulses and for thereafter converting said square wave pulses into timing pulses at a timing frequency;

a multiposition scaling switch to select a timing range encompassing the desired timing interval; and logic means responsive to the output of said scaling switch for enabling said timing pulses to increment said counter means only if said multiposition scaling switch is in a first position.

10. The improvement as defined in claim 9 and further including a pulse modifying circuit responsive to said timing pulses to generate second timing pulses at a second timing frequency;

said logic means for enabling said second timing pulses to increment said counter means only if said multiposition scaling switch is in a second position;

said second position for increasing the capacity of said counters by a scaling factor proportional to the ratio of the frequencies of said first timing pulses and said second timing pulses.

11. The invention as defined in claim 10 and further including a visual display incremented when said counter means is incremented; said visual display modified by said logic means to correspond to the particular position selected on said scaling switch.

12. In a digital timer logic circuit responsive to line current of different frequencies, and including a half-wave rectifier circuit to convert the line current into square wave pulses or the like at the line current frequency, counter means incremented by timing pulses of a frequency different from the line current frequency; means for comparing the value of the counter means with a desired timing interval; signal means actuated by the comparing means only when the value in the counter means equals the desired timing interval; and a start switch to clear the counter means and the signal means; the improvement comprising:

a differentiating circuit for determining the frequency of the line current by determining the frequency of the square wave pulses, said differentiating circuit also being directly cleared by the closing of said start switch;

said differentiating circuit for generating timing pulses at a timing frequency less than the line current frequency to increment said counter means.

13. The invention as defined in claim 12 wherein said differentiating circuit includes an internal source of clock pulses actuated by each square wave pulse;

a dual output logic unit responsive to both the clock pulses and the square wave pulses to provide an output signal indicative of the line current frequencies;

a pair of frequency modifying circuits operating simultaneously and in parallel in response to square wave pulses to generate output pulses on different paths at different frequencies, one of which is the timing frequency; and a pair of parallel dual input logic gates each receiving one input from only one output of the dual output logic unit and another input from one of said frequency modifying circuits;

said dual output logic unit for enabling only one of said logic gates to pass only the pulses at said timing frequency.

14. The invention as defined in claim 12 and further including display means incremented only when the timing pulses increment the counter means for providing a visual display of the elapsed time during the timing interval; said display means also being cleared by actuation of the start switch.

15. The invention as defined in claim 12 and further including a synchronization circuit responsive to the actuation of the start switch and the next successive square wave pulse to initiate the timing interval.

* * * * *